(12) United States Patent
Rehm-Gumbel

(10) Patent No.: US 11,243,123 B2
(45) Date of Patent: Feb. 8, 2022

(54) TEMPERATURE CALIBRATOR

(71) Applicant: SIKA Dr. Siebert & Kühn GmbH & Co. KG, Kaufungen (DE)

(72) Inventor: Michael Rehm-Gumbel, Niedenstein (DE)

(73) Assignee: SIKA Dr. Siebert & Kühn GmbH & Co. KG, Kaufungen (DE)

( * ) Notice: Subject to any disclaimer, the term of this patent is extended or adjusted under 35 U.S.C. 154(b) by 281 days.

(21) Appl. No.: 16/443,939

(22) Filed: Jun. 18, 2019

(65) Prior Publication Data

US 2019/0383674 A1 Dec. 19, 2019

(30) Foreign Application Priority Data

Jun. 19, 2018 (DE) .................. 10 2018 114 615.9

(51) Int. Cl.
*G01K 15/00* (2006.01)
*H05K 7/20* (2006.01)
*H02K 5/04* (2006.01)

(52) U.S. Cl.
CPC ......... *G01K 15/005* (2013.01); *G01K 15/002* (2013.01); *H02K 5/04* (2013.01); *H05K 7/20* (2013.01)

(58) Field of Classification Search
CPC .... G01K 15/005; G01K 15/00; G01K 15/002; H02K 5/04; H05K 7/20; B29C 48/904; B01J 2219/00054
See application file for complete search history.

(56) References Cited

U.S. PATENT DOCUMENTS

| 3,453,866 | A | * | 7/1969 | Simon | ................... | G01N 25/14 374/45 |
| 3,994,153 | A | * | 11/1976 | Gussman | ............ | G01F 25/0007 73/1.25 |
| 6,411,484 | B1 | * | 6/2002 | Tihanyi | ..................... | G01K 7/01 257/E23.08 |
| 7,789,622 | B2 | * | 9/2010 | Acre | ..................... | F04D 29/526 415/209.3 |

(Continued)

FOREIGN PATENT DOCUMENTS

DE 10 2008 039 931 A1 4/2009
EP 2835623 A * 2/2015

(Continued)

OTHER PUBLICATIONS

Temperature Calibrators, Series TP 28 1300 E—Operating Manual (Translation); SIKA Ba_TP281300E, Aug. 2015, pp. 29-56.

(Continued)

*Primary Examiner* — Gail Kaplan Verbitsky
(74) *Attorney, Agent, or Firm* — Dinsmore & Shohl LLP

(57) ABSTRACT

A temperature calibrator for calibrating temperature function devices has an outer and an inner housing as well as a calibrator block. The calibrator block is radially spaced from the inner housing to form a flow space. The flow space is in communication with the environment at the upper end and at the lower end to generate a flow. A fan having a fan wheel that can be driven by a motor is connected to the flow space. The fan wheel is formed from a heat-resistant material; and the fan forms a predominantly closed surface in a plan view.

19 Claims, 2 Drawing Sheets

(56) References Cited

U.S. PATENT DOCUMENTS

| | | | | |
|---|---|---|---|---|
| 8,721,173 | B2* | 5/2014 | Harslund | G01K 15/005 374/1 |
| 2001/0018027 | A1* | 8/2001 | Chen | F04D 29/703 417/423.7 |
| 2003/0127923 | A1 | 7/2003 | Gubbels | |
| 2007/0278202 | A1* | 12/2007 | Long | A47J 31/20 219/214 |
| 2007/0291814 | A1 | 12/2007 | Hirst | |
| 2008/0075585 | A1* | 3/2008 | Acre | F04D 29/164 415/177 |
| 2008/0112457 | A1* | 5/2008 | Mores | G01N 25/4826 374/31 |
| 2015/0295478 | A1* | 10/2015 | Creviston | H02K 5/225 310/68 D |
| 2020/0331138 | A1* | 10/2020 | Ejiri | B24B 23/02 |
| 2020/0370971 | A1* | 11/2020 | Lin | G01K 15/00 |
| 2020/0373808 | A1* | 11/2020 | St. Rock | H02K 9/06 |
| 2020/0400512 | A1* | 12/2020 | Lin | G01K 15/005 |
| 2021/0039215 | A1* | 2/2021 | Nakazawa | B23Q 5/10 |
| 2021/0063253 | A1* | 3/2021 | Gao | H05K 7/20209 |
| 2021/0123822 | A1* | 4/2021 | Maunumaki | G01R 22/061 |

FOREIGN PATENT DOCUMENTS

| | | |
|---|---|---|
| EP | 2835623 A1 | 2/2015 |
| JP | 090151898 A * | 6/1997 |

OTHER PUBLICATIONS

Friedrichs, R. et al., Temperature Calibrator with fast temperature control of the unit under test, GMA/ITG—Fachtagung Sensoren und Messsysteme 2016, pp. 645-650; Translation of the Abstract provided by the author, R. Friedrichs.

* cited by examiner

TEMPERATURE CALIBRATOR

CROSS-REFERENCE TO RELATED APPLICATION

This application claims priority of German Patent Application DE 10 2018 114 615.9 filed Jun. 19, 2018.

FIELD OF THE INVENTION

The present disclosure relates to a temperature calibrator for calibrating temperature function devices comprising an outer housing and an inner housing as well as a calibrator block, wherein the calibrator block has a radial spacing from the inner housing to form a flow space, with the flow space being in communication with the environment at the upper end and at the lower end to generate a flow, and with a fan having a fan wheel that can be driven by a motor being connected to the flow space.

BACKGROUND OF THE INVENTION

Temperature calibrators are sufficiently known. They typically serve the calibration of temperature function devices such as thermometers or also thermal switches.

The object of a calibrator comprises heating or cooling to a temperature specified by the user for a thermometer or also for a thermal switch and to keep the temperature constant over a specific time period. It is necessary for this purpose that certain information is input to the calibrator or to the control and regulation unit of the calibrator, e.g. the desired temperature or the regulation parameters for the regulation of the temperature to a specified level. The calibrator block as part of a temperature unit of the calibrator has at least one heating cartridge, a temperature reference sensor, and a so-called test specimen mount, that is, a mount, for example, for a thermometer.

As already explained at another passage, it is by all means known to heat and also to cool the calibrator block as part of the calibration unit. A motor-powered fan having a fan wheel is provided for cooling the calibrator block. The fan wheel is formed from plastic in accordance with the prior art. Due to the thermal stress on the fan wheel, the fan wheel has to run at a minimum speed of approximately 50% of the rated speed during the entire operation, and here in particular during heating up, with the thermal radiation of the calibrating block located above the fan additionally being shielded by means of a heat protection plate. To achieve sufficient heat shielding, only a few small bores are located in the heat protection plate, whereby, however, the larger part of the air flows generated by the fan is shielded. It has already been pointed out that for thermal reasons the fan always has to run at 50% of its rated power, with this also being the case during the heating-up phase. To this extent, not only the time of the heating-up phase up to the reaching of the desired temperature is extended, but also unnecessary energy is rather furthermore wasted. It is known in this connection also to use an adjustable shield instead of an air-permeable heat protection plate having small bores, with additional control and regulation hardware, however, being required to control the shield, which causes the complexity and the likelihood of failures to increase. The use of an air-permeable heat protection plate is ultimately a compromise between air permeability and heat shielding and to this extent has a disadvantageous effect on efficiency both during cooling and during heating.

SUMMARY OF THE INVENTION

It is now the underlying object of the disclosure to provide a remedy here; the efficiency in the heating-up phase should in particular be increased.

Provision is made to achieve the object that the fan wheel is formed from a heat-resistant material and that the fan forms a predominantly closed surface in a plan view. The following results from this. When the fan is formed from a heat-resistant material, in particular from a metal, such a fan wheel can withstand temperatures of up to 700° C. and more. Since the fan wheel of the fan forms a substantially closed surface in a plan view, an air flow through the flow space can be substantially suppressed, but at least reduced, with a stationary fan wheel, which appreciably shortens the heating-up phase of the calibrating block. The fan wheel is set into rotation to cool the calibrating block, that is, to generate an air flow around the calibrating block in the flow space, from which it becomes clear that the fan wheel satisfies two functions: The first function comprises shortening the heating-up phase during the heating-up phase of the calibrator block by reducing the air flow in the flow housing; a second function comprises, as is also known from the prior art, contributing to the cooling of the calibrator block by the fan wheel.

Advantageous features and embodiments of the disclosure are disclosed herein.

Provision is thus in particular made that the fan wheel is manufactured in that a disk-shaped base body has radially extending slits, with the sections formed by the slits being rotated out of the plane of the disk-shaped base body to form fan blades. Such a fan wheel admittedly has a somewhat smaller efficiency than a fan wheel in which the spacings between the individual fan blades are larger; the smaller efficiency can, however, be compensated by a higher speed to generate the required air flow. The area covered by the fan wheel is approximately 60% to 80% of a closed circular area, preferably approximately 75%. The coverage by the fan wheel also depends on the pivot angle of the fan blades. A higher degree of coverage can be achieved in that individual fan blades are installed separately as a fan wheel. This means that the fan blades can be selected correspondingly large for the coverage and thus also so large that the coverage is also greater than 100%.

It has already been pointed out at another passage that the fan is driven by a motor, in particular by an electric motor. Electric motors can typically withstand temperatures of approximately 80° C. to 90° C. Expensive motors can also withstand higher temperatures; however, it has been found that the stated temperature limit of 80° C. to 90° C. can be observed by the shielding of the motor by a motor shielding housing so that less expensive electric motors can also be used. Provision can be made in accordance with a special feature to use such motors that have their own fans, whereby the motor can additionally be protected from overheating.

Provision is furthermore advantageously made that the space formed by the motor shielding housing is in communication with the environment to ensure an exchange of air.

A further advantageous feature is characterized in that the fan wheel is arranged in an annular housing that extends in alignment with the inner housing so that it is ensured that, on the one hand, the flow space is predominantly sealed off by the fan wheel during the heating-up phase and that the cooling air generated by the fan wheel in the cooling-down phase can actually totally pass through the flow space.

Provision is made in accordance with a further feature of the disclosure that the fan wheel is connected to the motor by a motor shaft, with the length of the shaft being selected such that specific temperatures are not exceeded, namely the already previously mentioned temperatures in the range between 80° and 90° C. This means that a motor moved away from the fan wheel by a somewhat longer shaft also provides additional security against an overheating of the motor.

The temperature calibrator has an outer housing and an inner housing, wherein, in accordance with a further feature of the disclosure, the inner housing shows an insulation on the side facing the calibrator block in order, on the one hand, to shorten the heating-up phase and, on the other hand, to prevent the outer housing from becoming so hot that there is a risk of burns on contact for the operators.

The fan of the temperature calibrator may have a surface in plan view that is at least 50% closed, or at least 60% closed, or at least 70% closed

BRIEF DESCRIPTION OF THE DRAWING

The disclosure will be described in more detail by way of example with reference to the drawing.

DETAILED DESCRIPTION OF THE PREFERRED EMBODIMENTS

Figure 1:
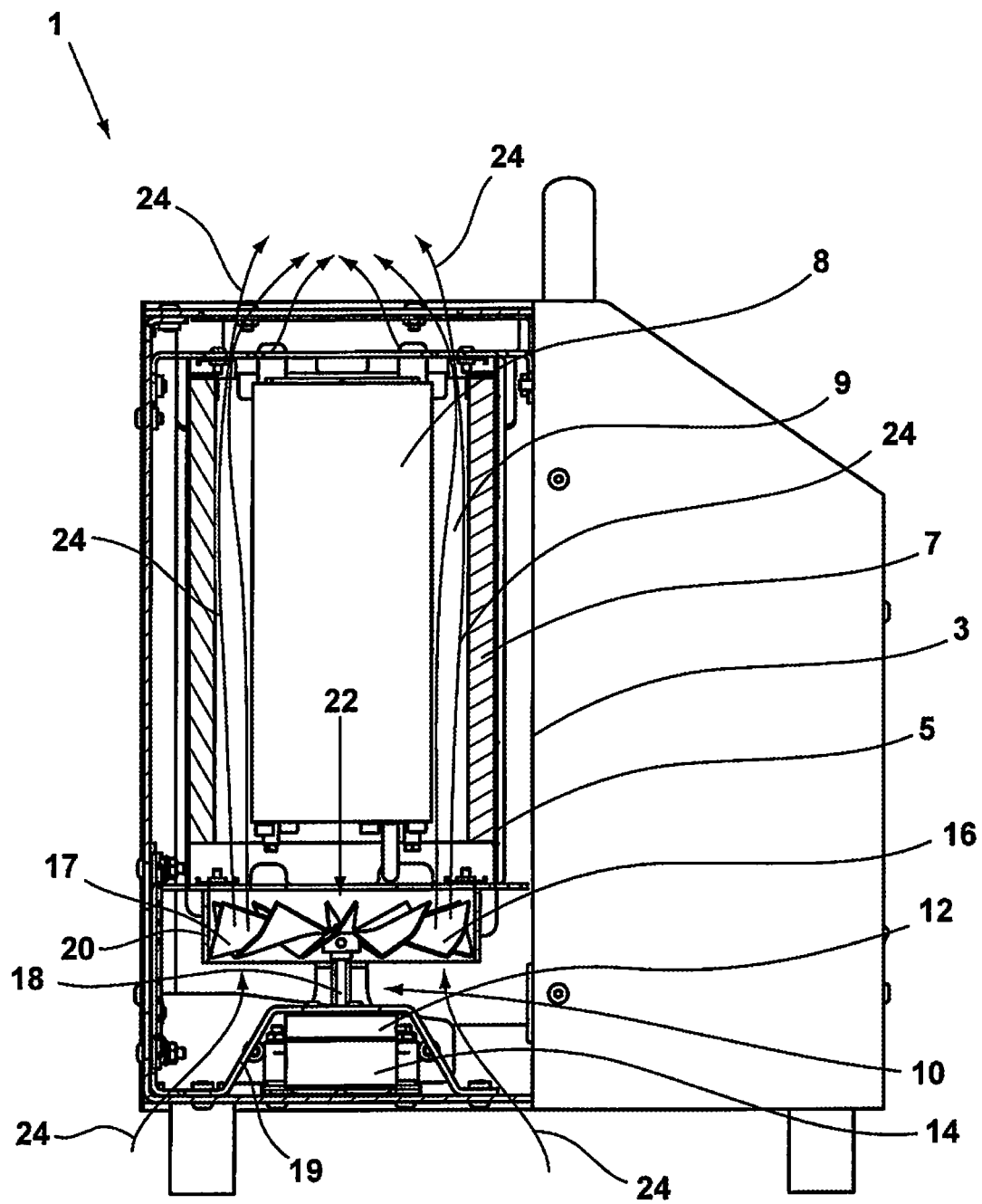
FIG. 1 is a sectional side view of a temperature calibrator in accordance with an embodiment of the present invention.

The temperature calibrator designed as a whole by 1 comprises the outer metal housing 3 and, spaced apart therefrom, the inner metal housing 5. The calibrator block 8 is located radially spaced apart from the inner metal housing 5 while forming a sleeve-like flow space 9. The inner metal housing 5 has an insulation 7 on the side facing the calibrator block 8 to prevent the outer metal housing from becoming too hot to avoid burns to the operators on it where possible. In the installed state below the calibrator block 8, the fan marked by 10 is located, with the fan marked by 10 having a motor 12 and a motor fan 14 for cooling the motor 12 that is located below the motor 12. The fan wheel 16 that is arranged in a so-called annular housing 20 is driven by the motor 12. The motor 12 is connected to the fan wheel 16 by the motor shaft 16. The motor shaft 18 is selected as comparatively long, with the length of the shaft 18 being in relation to the temperature that the motor is able to withstand. A temperature range between 80° C. and 90° C. that an electric motor can withstand has already been named at a different passage in this connection. Not only the length of the motor shaft 18 is decisive for the observing of specific temperature ranges for the electric motor, but also the arrangement of the motor 12 in a motor shielding housing 19 that additionally shields the motor 12 from thermal radiation. The bottom of the outer housing beneath the hood-shaped motor shielding housing 19 has openings to also provide the corresponding cooling by the motor fan 14.

The annular housing 20 is aligned with the inner metal housing 5 or with the sleeve-like flow space 9 so that in operation of the fan wheel 16, the air flow generated by the fan wheel 16 is substantially fully provided to cool the calibrator block through the sleeve-like flow space 9. In operation of the fan 10 respectively of the fan wheel 16, fresh air is sucked in through openings (not shown) in the bottom of the inner and of the outer metal housing 3, is led through the sleeve-like flow space 9, with the heated air flow then being led off through openings, not shown, in the top of the inner and outer housings.

The fan wheel 16 is characterized in detail in that the fan blades 17 are manufactured in that, for example, a circular metal sheet has radially extending slits to then rotate or fold the sections formed by the slits so that a shape of the air blades 17 results as shown in the drawing. In the plan view in accordance with the arrow 22, the fan wheel appears substantially closed except for the slits expanded by the folding of the blades so that only a small air flow or no substantial air flow takes place through the sleeve-like flow space 9 in the heating-up phase. of the calibrator block 8. This means that the flow space 9 is very largely covered by the fan wheel.

Figure 2:
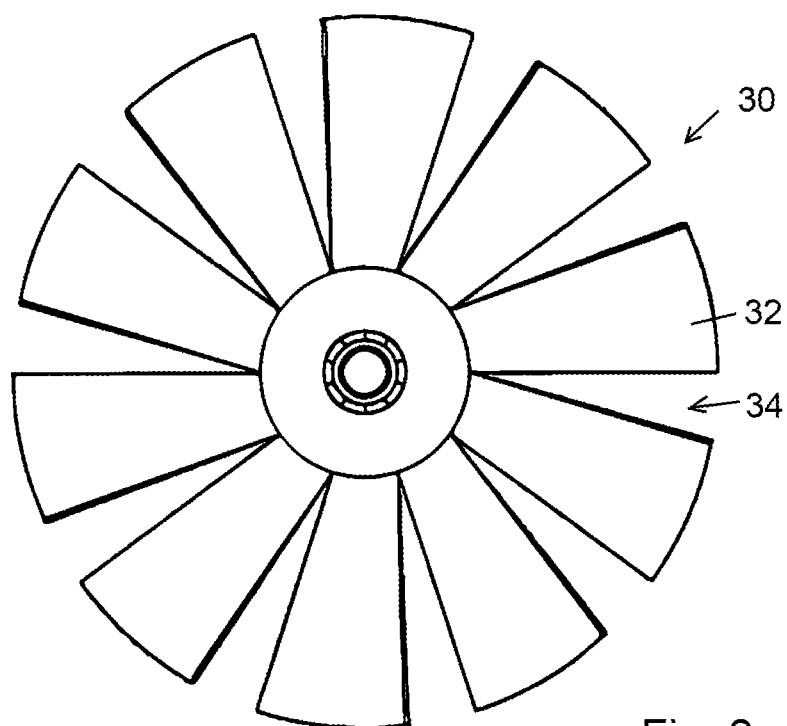
FIG. 2 is a plan view of a fan that forms part of one embodiment of a temperature calibrator in accordance with the present invention.
Figure 3:
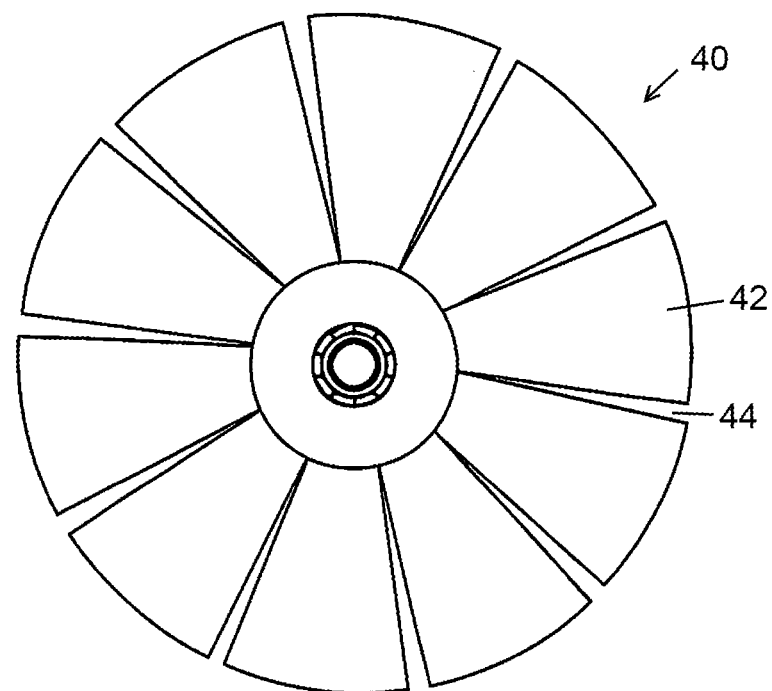
FIG. 3 is a plan view of another fan that forms part of another embodiment of a temperature calibrator in accordance with the present invention.

FIGS. 2 and 3 provide plan views of two exemplary fans which may form part of embodiments of the temperature calibrators in accordance with the present invention. These fans each are considered to form a predominantly closed surface in the plan view. The fan 30 of FIG. 2 has a blade area of the fan blades 32, in plan view, of about 554 mm² and the slits 34 have a total area of about 176 mm². As such, the total swept area (fan blades 32 plus slits 34), in plan view, of about 730 mm². Consequently, the fan 30 has an open surface (slits 34) of about 24% and a closed surface (blades 32) of about 76%, which is considered to be a "predominantly closed surface in plan view." The fan 40 of FIG. 3 has an open surface (slits 44) of about 18% and a closed surface (blades 42) of about 72%. Again, this is considered to be a "predominantly closed surface in plan view." As used herein, a "predominantly closed surface in plan view" is defined to mean that the closed surface (fan blades) is greater than the open surface (slits), so the closed surface is greater than 50%. In some embodiments, the closed surface is greater than 60%. In further embodiments, the closed surface is greater than 70%.

As will be clear to those of skill in the art, the embodiments disclosed herein may be altered in various ways without departing from the scope of the present invention. It is the claims, including all equivalents, which define the scope of the invention.

REFERENCE NUMERAL LIST 1 temperature calibrator
3 outer metal housing
5 inner metal housing
7 insulation
8 calibrator block
9 flow space
10 fan
12 motor
14 motor fan
16 fan wheel
17 fan blades
18 motor shaft
19 motor shielding housing
20 annular housing
22 arrow
30 fan
32 fan blades
34 fan slits
40 fan
42 fan blades
44 fan slits

The invention claimed is:

1. A temperature calibrator for calibrating temperature function devices, comprising:
   an outer and an inner housing;
   a calibrator block radially spaced from the inner housing so as to form a flow space having an upper end and a lower end, the flow space being in communication with the environment at the upper end and at the lower end to generate a flow, the calibrator block having a heating-up phase and a cooling phase;
   a fan having a fan wheel driven by a motor, the fan being connected to the flow space, the fan wheel being formed from a heat-resistant material, the fan wheel of the fan forming an at least 60% closed surface in a plan view when stationary, suppressing the flow through the flow space and shortening the heating-up phase.

2. The temperature calibrator in accordance with claim 1, wherein the fan wheel is manufactured from metal.

3. The temperature calibrator in accordance with claim 1 wherein the fan wheel comprises a disk-shaped base body having radially extending slits, with sections formed by the slits being rotated out of the plane of the disk-shaped base body to form fan blades.

4. The temperature calibrator in accordance claim 1, wherein the motor of the fan is shielded by a motor shielding housing.

5. The temperature calibrator in accordance with claim 4, wherein the motor has a motor fan located within the motor shielding housing.

6. The temperature calibrator in accordance with claim 4 wherein a space formed by the motor shielding housing is in communication with the environment.

7. The temperature calibrator in accordance with claim 1, wherein the fan wheel is arranged in an annular housing that extends in alignment with the inner housing.

8. The temperature calibrator in accordance with claim 1, wherein the fan wheel is connected to the motor by a motor shaft, with the length of the shaft being selected such that a predetermined temperature at the motor is not exceeded.

9. The temperature calibrator in accordance with claim 1, wherein the inner housing has an insulation on a side facing the calibrator block.

10. A temperature calibrator for calibrating temperature function devices, comprising:
    an outer and an inner housing;
    a calibrator block radially spaced from the inner housing so as to form a flow space having an upper end and a lower end, the flow space being in communication with the environment at the upper end and at the lower end to generate a flow, the calibrator block having a heating-up phase and a cooling phase; and
    a fan having a fan wheel driven by a motor, the fan being connected to the flow space, the fan wheel being formed from a heat-resistant material, the fan wheel of the fan forming an at least 70% closed surface in a plan view when stationary, suppressing the flow through the flow space and shortening the heating-up phase.

11. The temperature calibrator in accordance with claim 10, wherein the fan wheel is manufactured from metal.

12. The temperature calibrator in accordance with claim 10 wherein the fan wheel comprises a disk-shaped base body having radially extending slits, with sections formed by the slits being rotated out of the plane of the disk-shaped base body to form fan blades.

13. The temperature calibrator in accordance claim 10, wherein the motor of the fan is shielded by a motor shielding housing.

14. The temperature calibrator in accordance with claim 13, wherein the motor has a motor fan located within the motor shielding housing.

15. The temperature calibrator in accordance with claim 13 wherein a space formed by the motor shielding housing is in communication with the environment.

16. The temperature calibrator in accordance with claim 10, wherein the fan wheel is arranged in an annular housing that extends in alignment with the inner housing.

17. The temperature calibrator in accordance with claim 10, wherein the fan wheel is connected to the motor by a motor shaft, with the length of the shaft being selected such that a predetermined temperature at the motor are not exceeded.

18. The temperature calibrator in accordance with claim 10, wherein the inner housing has an insulation on a side facing the calibrator block.

19. A method of using a temperature calibrator for calibrating temperature function devices, comprising the steps of:
    providing a temperature calibrator having:
        an outer and an inner housing;
        a calibrator block radially spaced from the inner housing so as to form a flow space having an upper end and a lower end, the flow space being in communication with the environment at the upper end and at the lower end to generate a flow;
    a fan having a fan wheel driven by a motor, the fan being connected to the flow space, the fan wheel being formed from a heat-resistant material, the fan wheel of the fan forming an at least 60% closed surface in a plan view when stationary;
    in a heating-up phase, heating-up the calibrator block while the fan wheel is stationary thus suppressing the flow through the flow space and shortening the heating-up phase; and
    in a cooling phase, rotating the fan to cool the calibrator block when the calibrator block has reached a desired temperature.

* * * * *